(12) United States Patent
Shiota et al.

(10) Patent No.: US 7,582,540 B2
(45) Date of Patent: Sep. 1, 2009

(54) METHOD FOR MANUFACTURING SOI WAFER

(75) Inventors: Takaaki Shiota, Karatsu (JP); Yasuhiro Oura, Imari (JP)

(73) Assignee: Sumco Corporation, Tokyo (JP)

( * ) Notice: Subject to any disclaimer, the term of this patent is extended or adjusted under 35 U.S.C. 154(b) by 318 days.

(21) Appl. No.: 11/289,307

(22) Filed: Nov. 30, 2005

(65) Prior Publication Data
US 2006/0121696 A1 Jun. 8, 2006

(30) Foreign Application Priority Data
Dec. 2, 2004 (JP) ............... 2004-350285

(51) Int. Cl.
*H01L 21/30* (2006.01)
(52) U.S. Cl. ............. 438/459; 438/149; 438/455; 438/471; 438/477; 438/479; 438/778; 438/783; 438/787; 438/791
(58) Field of Classification Search ............. 438/149, 438/455, 459, 471, 477, 479, 778, 783, 787, 438/791
See application file for complete search history.

(56) References Cited

U.S. PATENT DOCUMENTS

| 5,780,311 | A | * | 7/1998 | Beasom et al. | ........... 438/406 |
| 5,801,084 | A | * | 9/1998 | Beasom et al. | ........... 438/457 |
| 6,004,866 | A | * | 12/1999 | Nakano et al. | ........... 438/459 |
| 6,326,285 | B1 | * | 12/2001 | Behfar et al. | ........... 438/455 |
| 7,186,628 | B2 | * | 3/2007 | Nakano | ........... 438/455 |
| 2004/0070045 | A1 | * | 4/2004 | Suguro et al. | ........... 257/506 |
| 2005/0130394 | A1 | * | 6/2005 | Falster | ........... 438/480 |

FOREIGN PATENT DOCUMENTS

| JP | 409022993 A | * | 1/1997 |
| JP | 2001-44398 A | | 2/2001 |

* cited by examiner

*Primary Examiner*—Kevin M Picardat
*Assistant Examiner*—Bac H Au
(74) *Attorney, Agent, or Firm*—Pillsbury Winthrop Shaw Pittman, LLP

(57) ABSTRACT

This method for manufacturing an SOI wafer includes: a step of forming insulating films in a front surface and a mirror-polished rear surface of an active layer wafer; a step of removing the insulating film in the front surface of the active layer wafer; a step of subjecting the active layer wafer to a rapid thermal annealing process; a step of bonding the active layer wafer and a support wafer with the insulating film formed in the rear surface therebetween so as to form a bonded wafer; a step of subjecting the bonded wafer to a heat treatment for bonding enhancement which enhances a bonding strength between the active layer wafer and the support wafer; and a step of thinning the active layer wafer in the bonded wafer so as to form an SOI layer.

2 Claims, 2 Drawing Sheets

METHOD FOR MANUFACTURING SOI WAFER

BACKGROUND OF THE INVENTION

1. Field of the Invention

The present invention relates to a method for manufacturing an SOI wafer, more specifically, it relates to an improvement of a method for manufacturing an SOI wafer in which an active layer wafer and a support wafer are bonded.

This application claims priority from Japanese Patent Application No. 2004-350285, filed on Dec. 2, 2004, the content of which is incorporated herein by reference.

2. Background Art

Compared with conventional silicon wafers, SOI (Silicon On Insulator) wafers having an SOI layer have advantages such as providing a separation between elements and a reduction in parasitic capacitance between elements and a substrate, and having the capability to form a three-dimensional configuration; thereby the SOI wafers are used for high speed, low power consumption LSI circuits. An examples of one of the methods for manufacturing an SOI wafer is a bonding method in which an oxide film is formed in at least one of two silicon wafers and the silicon wafers are bonded, and then the bonded wafer is ground and polished so as to form an SOI layer.

Regarding the bonding method, the SOI wafer may be manufactured, for example, as follows as described in Patent Document 1. At first, an active layer wafer of which one surface is mirror-polished and a support wafer of which one surface is mirror-polished are prepared. Next, an insulating film (an oxide film) having a predetermined thickness is formed in a surface (a mirror-polished surface) of the active layer wafer. And then, the active layer wafer and the support wafer are bonded together to form a bonded wafer such that the surface (the mirror-polished surface) in which the oxide film is formed and the surface (the mirror surface) of the support wafer are used as bonding surfaces.

After the bonding, the bonded wafer is subjected to a heat treatment so as to enhance the bonding strength between the active layer wafer and the support wafer. After this, a portion of the active layer wafer is ground and polished; thereby, an SOI wafer having an SOI layer of a predetermined thickness can be obtained.

Here, as described above, in the bonding method, the heat treatment is conducted so as to enhance the bonding strength between the active layer wafer and the support wafer, and such a heat treatment is carried out, for example, in an oxygen atmosphere. However, during the heat treatment for bonding enhancement, metal impurities existing in an atmosphere may contaminate the bonded wafer. The metal impurities in this case are, for example, Fe, Cu, Ni, and the like.

As a result, metal impurities exist in the entire surface of the bonded wafer. Thus, in the bonded wafer, the metal impurities also exist in the SOI layer which becomes an active layer after a process of grinding and polishing a portion of the active layer wafer. Therefore, the SOI wafer having the SOI layer including metal impurities does not satisfy electrical characteristics in a device process.

(Patent Document 1) Japanese Unexamined Patent Application, First Publication No. 2001-44398

SUMMARY OF THE INVENTION

As a result of intensive research, the present inventors have found that it is possible to manufacture a bonded SOI wafer having a defect-free SOI layer by the following method. A bulk micro defect (BMD) layer including a high concentration of oxygen precipitates is formed in a bulk of an active layer wafer; thereby, after heat treatment for bonding enhancement, metal impurities are gettered using the BMD layer; and then, the BMD layer is removed by grinding and polishing. Thus, the present invention was completed.

An object of the present invention is to provide a method for manufacturing an SOI wafer in which contaminating metal impurities deposited during the heat treatment for bonding enhancement are gettered by the BMD layer; thereby an SOI wafer having a defect-free SOI layer is obtained.

A method for manufacturing an SOI wafer of the present invention includes: a step of forming insulating films in a front surface and a mirror-polished rear surface of an active layer wafer; a step of forming insulating films in a front surface and a rear surface of an active layer wafer which are mirror-polished; a step of removing the insulating film in the front surface of the active layer wafer; a step of subjecting the active layer wafer to a rapid thermal annealing process; a step of bonding the active layer wafer and a support wafer with the insulating film formed in the rear surface therebetween so as to form a bonded wafer; a step of subjecting the bonded wafer to a heat treatment for bonding enhancement which enhances a bonding strength between the active layer wafer and the support wafer; and a step of thinning the active layer wafer in the bonded wafer so as to form an SOI layer.

Silicon wafers manufactured by the Czochralski method may be used for the active layer wafer and the support wafer.

The insulating film formed in the front and rear surfaces of the active layer wafer may be an oxide film or a nitride film.

In the active layer wafer, vacancies are implanted into a surface of the wafer by the RTA (Rapid Thermal Annealing) process, and the subsequent heat treatment causes oxygen precipitation to form a BMD (bulk micro defect) layer. Here, the BMD layer may be formed in the support wafer as well as the active layer wafer.

The thinning of the active layer wafer is performed by, for example, grinding and polishing the surface of the wafer. Alternatively, the thinning may be performed by implanting ions into the active layer wafer, heating the wafer to cause delamination, and polishing the wafer.

In the method for manufacturing an SOI wafer of the present invention, at first an insulating film having a predetermined thickness is formed in each of a front surface and a rear surface of the active layer wafer. Then, the insulating film on the front surface side (opposite side of the mirror-polished surface) of the active layer wafer is removed. For example, in the case in which the insulating film is a silicon oxide film, the film can be removed by immersing in an HF solution. Next, the active layer wafer is subjected to an RTA process (a heat treatment of rapid heating and rapid cooling). By this process, in the active layer wafer in which the insulating film is removed, vacancies are implanted into an inside of the active layer wafer from the front surface thereof, and a vacancy layer including a high concentration of vacancies is formed in a surface portion of the wafer. Then, the active layer wafer and a support wafer are bonded together while the rear surface in which the insulating film is formed in the active layer wafer and a front surface (a mirror-polished surface) of the support wafer are used as bonding surfaces. Thereby, a bonded wafer (a bonded wafer having an SOI structure) in which the insulating film intervenes between the active layer wafer and the support wafer can be obtained.

After this process, the bonded wafer is subjected to a heat treatment for bonding enhancement in an oxygen atmosphere to enhance the bonding strength between the active layer wafer and the support wafer. During this, there is a risk that the bonded wafer may be contaminated with metal impurities in a furnace atmosphere.

In the heat treatment for bonding enhancement, many oxygen precipitates and interstitial silicon atoms are formed in a bulk portion of the active layer wafer. Among them, the interstitial silicon atoms are diffused towards the surface of the active layer wafer; thereby causing the vacancies in the above-described vacancy layer to disappear, and thus forming a denuded zone in this surface portion. Also, a BMD layer including a high concentration of oxygen precipitates is formed in the bulk portion, depending on a distribution of vacancy; under the DZ layer and a wafer depth center. The BMD layer functions as a gettering layer to getter the metal impurities.

The metal impurities contaminating the bonded wafer are gettered by the BMD layer.

After this, the BMD layer in which the metal impurities are gettered is removed by, for example, grinding and polishing the active layer wafer from the front surface thereof.

On the other hand, a denuded zone layer (on the insulating film side of the active layer wafer) which does not include the metal impurities due to an effect of the above-described gettering, is used as an SOI layer. As a result, an SOI wafer having a defect-free SOI layer which does not contain metal impurities can be obtained.

In the method for manufacturing an SOI wafer of the present invention, the above-described RTA process may be conducted in a nitridation gas atmosphere, and the RTA process may include: heating up a temperature from room temperature to a preset temperature at a heating up rate of 10 to 100° C./sec; holding at the preset temperature for 1 to 60 seconds; and lowering the temperature from the preset temperature to room temperature at a lowering rate of 10 to 100° C./sec. The preset temperature may be set to in a range from 1100° C. to 1250° C.

In the case in which the heating up rate and the lowering rate in the RTA process are less than 10° C./sec, a throughput drops.

In the case in which the heating up rate and the lowering rate exceed 100° C./sec, an in-plane temperature distribution becomes nonuniform so that curvature and slip dislocations are easily formed.

The preset temperature is held in a range from 1100° to 1250° C. In the case in which the preset temperature is less than 1100° C., it is difficult to form the vacancy layer. In the case in which the preset temperature is more than 1250° C., slip dislocations are generated in the active layer wafer, and curvature appears in the active layer silicon wafer.

By this RTA process to which the active layer wafer is subjected, vacancies are implanted into the active layer wafer.

By using the nitridation gas atmosphere such as $N_2$, $NH_3$ and the like, a nitride film can be formed in the surface of the silicon wafer, which facilitates vacancy implantation. The number of vacancies to be implanted is not limited.

When using a nitridation gas atmosphere including $NH_3$, $NH_3$ dissociates to generate hydrogen, which removes a natural insulating film formed in the surface of the silicon wafer. Furthermore, a nitride film is formed in the surface of the silicon wafer, which facilitates vacancy implantation.

As described above, in the method for manufacturing an SOI wafer in which the heating up rate, the preset temperature, and the lowering rate of the RTA process are specified, the active layer wafer is subjected to the RTA process. The RTA process is carried out in the nitridation gas atmosphere. Thereby, vacancies are implanted in the front surface of the active layer wafer in which the insulating film is removed.

Also, a vacancy layer including a high concentration of vacancies is formed in the surface portion of the active layer wafer.

After this, the active layer wafer and a support wafer are bonded with each other. Then, the bonded wafer is subjected to a heat treatment for bonding enhancement.

Then, interstitial silicon atoms and oxygen precipitates are formed in the bulk portion of the active layer wafer.

In the bulk portion, the BMD layer including a high concentration of the oxygen precipitates is formed. The BMD layer functions as a gettering layer to getter metal impurities contaminated during the heat treatment for bonding enhancement.

Also, the interstitial silicon atoms are diffused towards the surface thereof, thereby eliminating vacancies in the vacancy layer in the surface portion. As a result, a DZ (denuded zone) layer is formed in the surface portion of the active layer wafer. After this, an SOI wafer is manufactured by thinning the active layer wafer side.

In the present invention, at first, the insulating film is formed in the front surface and the rear surface of the active layer wafer; thereafter, the insulating film on the front surface side is removed by, for example, the HF solution, and the active layer wafer is subjected to the RTA process. Then, vacancies are implanted in the surface of the active layer wafer; thereby the vacancy layer is formed in the surface portion.

Next, the active layer wafer and the support wafer are bonded together while the surface (the mirror-polished surface) in which the insulating film is formed is used as the bonding surface. Thus, the bonded wafer in which the insulating film intervenes between the active layer wafer and the support wafer can be obtained. After this, the bonded wafer is subjected to the heat treatment for bonding enhancement in an oxidizing atmosphere such as an atmosphere including oxygen and the like, which enhances the bonding strength between the active layer wafer and the support wafer. During this, the BMD layer including a high concentration of the oxygen precipitates is formed in the bulk portion. Simultaneously, the denuded zone is formed in the surface portion of the active layer wafer. Thus, metal impurities contaminating the bonded wafer are gettered by the BMD layer. After this, the BMD layer which has gettered the metal impurities is removed by, for example, grinding and polishing, and the denuded zone layer including no metal impurities can be used as the SOI layer. As a result, the SOI wafer having the defect-free SOI layer including no metal impurities can be obtained.

Here, the support wafer may also be subjected to the rapid thermal annealing process. In this case, the support wafer can obtain a gettering effect; thereby, impurities can be gettered when the support wafer are exposed in an atmosphere containing impurities.

PREFERRED EMBODIMENTS

An embodiment of the present invention will be explained below with reference to FIGS. 1 to 3.

At first, a method for manufacturing an SOI wafer 10 will be explained with reference to FIG. 1.

Figure 1:
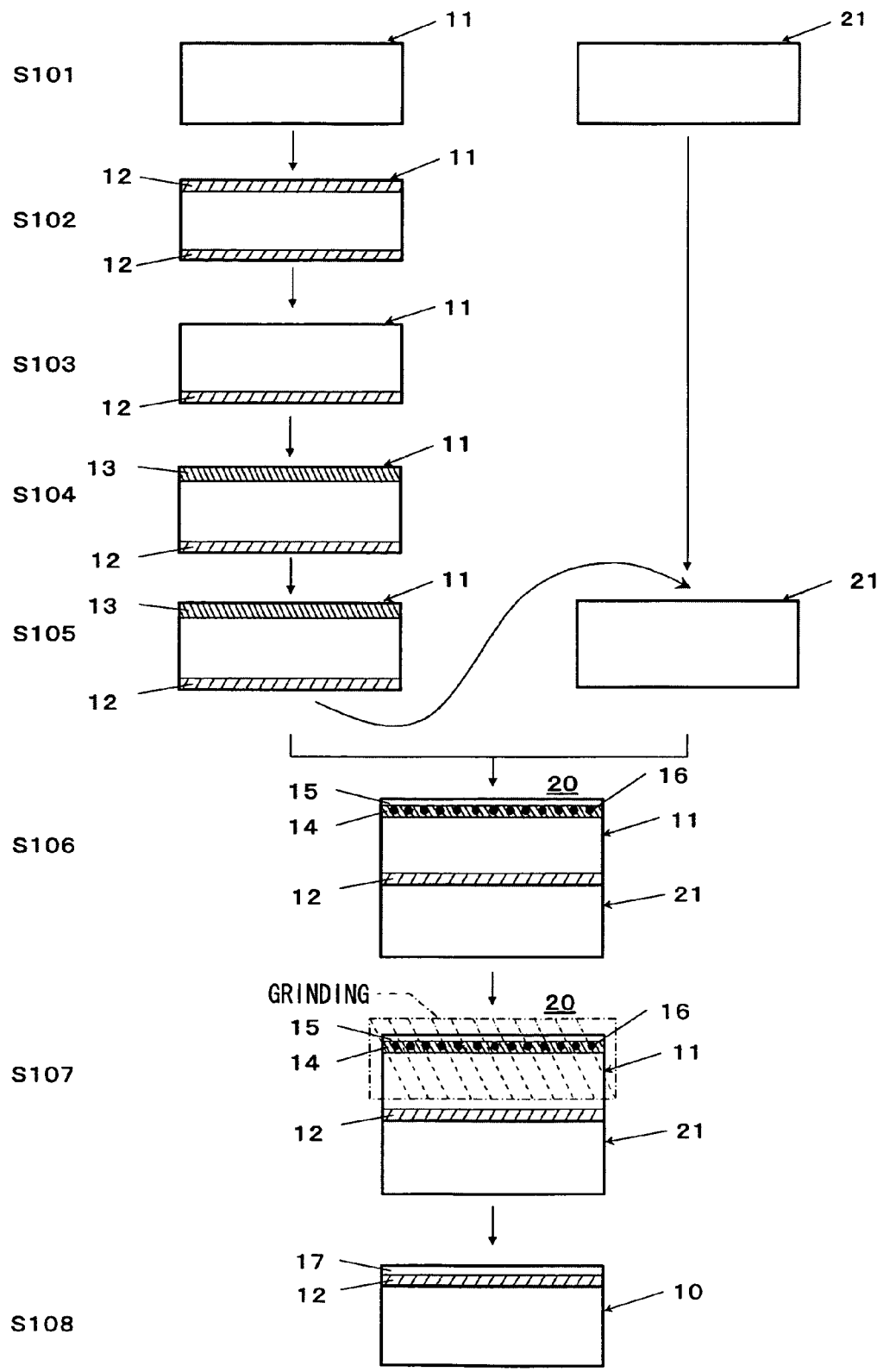
FIG. 1 is a flowchart illustrating a flow of the method for manufacturing an SOI wafer according to an embodiment of the present invention.

At first, as shown in step S101 in FIG. 1, two silicon wafers having thicknesses of 725 μm, diameters of 200 mm, and resistivities of 20Ω·cm are prepared by slicing from a single-crystal silicon ingot grown by the Czochralski method in which boron is uniformly doped. Then, one surface of each of these silicon wafers is subjected to mirror-polishing by a known process. One of these silicon wafers is used as an active layer wafer 11, and the other is used as a support wafer 21.

Next, as shown in step S102 in FIG. 1, an oxide film 12 having a predetermined thickness is formed in each of a front surface and a rear surface of the silicon wafer which is used as the active layer wafer 11. The oxide film 12 is formed by charging the silicon wafer in an oxidation furnace and heating the wafer at 1000° C. for 4 hours. A thickness of the formed oxide film 12 is for example, 1500 Å.

After this, as shown in step S103 in FIG. 1, the oxide film 12 only on the front surface side of the active layer wafer 11 is removed. For example, only a portion on the front surface side is exposed to an HF etchant. The reason for removing the oxide film 12 only on the front surface side of the active layer wafer 11 is that after this removal, vacancies are implanted in the front surface side by carrying out an RTA process. The oxide film on the rear surface side of the mirror-polished surface remains. For the support wafer, it is sufficient that at least one surface thereof is mirror-polished, and the support wafer may be subjected to the oxidation or the RTA process.

Next, as shown in step S104 in FIG. 1, the active layer wafer 11 is charged into a known rapid heating furnace. In the heating furnace, the active layer wafer 11 is subjected to a rapid heating and rapid cooling (RTA: Rapid Thermal Annealing) process in a nitridation gas atmosphere. The RTA process is carried out in the nitridation gas atmosphere by heating up a temperature from room temperature to 1250° C. at a heating up rate of 50° C./sec; next, holding the temperature at 1200° C. for 10 seconds; and then, lowering the temperature from 1200° C. to room temperature at a lowering rate of 70° C./sec.

Thus, in the active layer wafer 11 in which the oxide film 12 in the front surface is removed, a vacancy layer 13 including a high concentration of vacancies ($1\times10^{13}$ atoms/cm$^3$) is formed in a surface portion in which the oxide film 12 is removed.

Since the atmosphere in the RTA process is nitridation gas, a nitride film is formed in the surface of the active layer wafer, which facilitates vacancy implantation.

Figure 2:
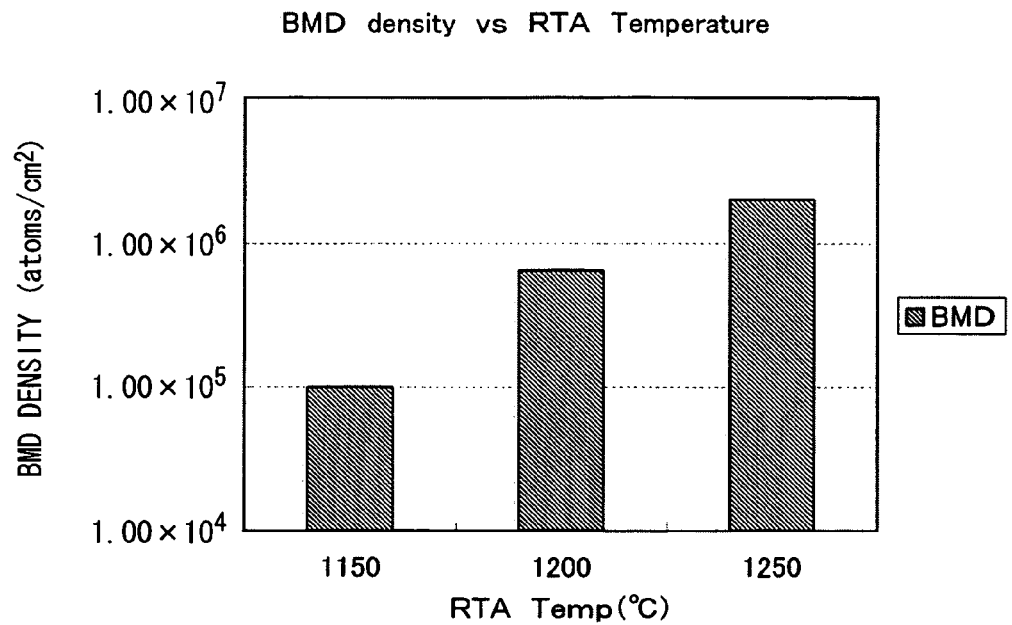
FIG. 2 is a graph showing a relationship between an RTA process temperature and a BMD in an SOI wafer according to the embodiment of the present invention.
Figure 3:
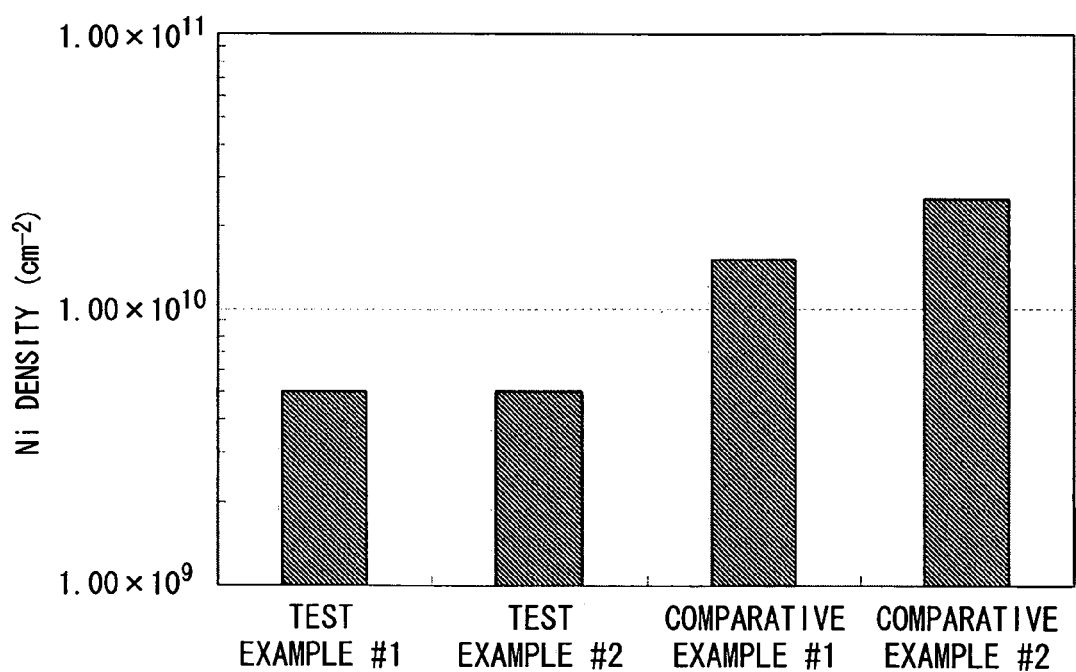
FIG. 3 is a graph showing an experimental result which verifies a gettering effect of the SOI wafer according to the embodiment of the present invention.

FIG. 2 is a graph showing a relationship between the RTA process temperature and the BMD.

Next, as shown in step S105 in FIG. 1, the support wafer 21 is mounted on a wafer boat. Then, the active layer wafer 11 and the support wafer 21 are bonded together while the rear surface (the mirror-polished surface) of the active layer wafer 11 in which the oxide film 12 is formed is used as a bonding surface. The bonding is carried out using a predetermined jig at room temperature. As a result, a bonded wafer 20 in which the oxide film 12 (a BOX layer: a buried oxide film) intervenes in a bonded boundary surface is formed.

After this, as shown in step S106 in FIG. 1, the bonded wafer 20 is subjected to a heat treatment for bonding enhancement in order to enhance a bonding strength between the active layer wafer 11 and the support wafer 21. The heat treatment for bonding enhancement is conducted at a temperature of 1100° or more for about 2 hours in an oxidizing gas atmosphere.

During this, in a bulk portion of the active layer wafer 11, a large number of interstitial silicon atoms and oxygen precipitates are formed. The interstitial silicon atoms are diffused towards a surface portion of the active layer wafer 11, so that the vacancies are eliminated. Therefore, a denuded zone (DZ) layer 15 having a thickness of 15 μm is formed. Also, a BMD layer 14 including a high concentration of the oxygen precipitates is formed in the bulk portion, depending on a distribution of vacancy; under the DZ layer 15 and a wafer depth center.

During the heat treatment for bonding enhancement, metal impurities 16 existing in the atmosphere contaminate the bonded wafer 20.

However, the BMD layer 14 is formed in the active layer wafer 11 of the bonded wafer 20. The BMD layer 14 functions as a gettering layer to getter the metal impurities 16 contaminating the bonded wafer 20. Therefore, the metal impurities 16 which appear during the heat treatment for bonding enhancement are gettered at the BMD layer 14.

In other words, a portion on the front surface side of the active layer wafer 11 includes the BMD layer 14 and the gettered metal impurities 16. On the other hand, a portion on the rear surface side (a side on which the oxide film 12 is formed) of the active layer wafer 11 includes a layer which does not contain the metal impurities 16.

Then, as shown in step S107 in FIG. 1, the front surface of the active layer wafer 11 of the bonded wafer 20 (a surface on the opposite side of the bonded surface) is ground by a predetermined thickness using a grinding system. Thus, the BMD layer 14 including the metal impurities 16 is ground, while the layer which does not contain metal impurities on the rear surface side of the active layer wafer 11 is not removed but remains. As a result, an SOI layer 17 which does not contain the metal impurities 16 can be obtained.

Next, the front surface (the ground surface) of the bonded wafer 20 is subjected to mirror-polishing. The polishing is a known chemical mechanical polishing (polishing of a silicon surface using a polishing cloth and an abrasive compound). As a result, the SOI layer (silicon layer) 17 having a predetermined thickness is formed on a surface of the BOX layer 12. The SOI layer 17 can be used as a device-forming layer.

After this, as shown in step S108 in FIG. 1, if needed, the SOI layer 17 is subjected to a further thinning process so as to complete the SOI wafer 10. The thinning process involves, for example, the bonded wafer 20 being subjected to a wet oxidation process in an oxidizing atmosphere. Thereby, an oxide film (not shown) having a predetermined thickness is formed in the surface of the SOI layer 17. Then, the oxide film is removed by, for example, an HF etching; thereby, the SOI layer 17 is thinned. Alternatively, ion implantation before bonding and abruption (peeling) can also be adopted for forming the SOI layer 17.

Next, experimental results which verified a gettering effect of the SOI wafer 10 by using Ni will be described.

In detail, the BMD layer 14 was formed in the active layer wafer 11 by the steps S101 to 108 in FIG. 1 to manufacture the bonded wafer 20. Next, a solution including Ni (the metal impurities 16) was coated on the bonded wafer 20. Then, experiments were performed to verify the effects to getter Ni in the SOI wafer 10 during the heat treatment for bonding enhancement. The results are shown in FIG. 3. Test examples #1 and #2 were conducted on the two SOI wafers 10 in which the BMD layer 14 was formed in the mirror-polished active layer wafer 11 by the steps S101 to S108 in FIG. 1. Comparative examples #1 and #2 were conducted on two SOI wafers 10 in which the above-described BMD layer 14 was not formed on the mirror-polished active layer wafer 11.

According to the results of the above-described experiments, it can be confirmed that the SOI wafer 10 which has the SOI layer 17 including no metal impurities could be obtained by forming the BMD layer 14 in the bulk of the active layer wafer 11 during the heat treatment for bonding enhancement, and grinding and polishing the BMD layer 14 together with the gettered metal impurities 16.

A preferred embodiment of the present invention has been explained above, but the present invention is not limited to the embodiment. The present invention can be modified by addition, omission, or replacement of the structure to an extent not departing from the spirit of the present invention. The present invention is not limited by the above-described explanation, but is limited only by the scope of the appended claims.

What is claimed is:

1. A method for manufacturing an SOI wafer, said method comprising:

forming insulating films in a front surface and a mirror-polished rear surface of an active layer wafer;

removing said insulating film in said front surface of said active layer wafer;

after the removing, subjecting said active layer wafer to a rapid thermal annealing process in a nitridation gas atmosphere to form a vacancy layer including vacancies in a surface portion of said front surface;

bonding said active layer wafer and a support wafer with said insulating film formed in said rear surface therebetween so as to form a bonded wafer, after the rapid thermal annealing process;

subjecting said bonded wafer to a heat treatment for bonding enhancement in an oxidizing atmosphere which enhances a bonding strength between said active layer wafer and said support wafer and forms a denuded zone layer in said surface portion of said front surface and a BMD layer under said denuded zone layer in said active layer wafer; and thinning said active layer wafer in said bonded wafer and removing said denuded zone layer and said BMD layer so as to form an SOI layer in a surface portion of said rear surface of said active layer wafer.

2. The method for manufacturing an SOI wafer according to claim 1, wherein said rapid thermal annealing process is conducted in a nitridation gas atmosphere, said rapid thermal annealing process comprises: heating up a temperature from room temperature to a preset temperature at a heating up rate of 10 to 100° C./sec; holding said preset temperature for 1 to 60 seconds; and lowering said temperature from said preset temperature to room temperature at a lowering rate of 10 to 100° C./sec, and said preset temperature is set to in a range from 1100° C. to 1250° C.

* * * * *